United States Patent [19]

Murooka

[11] Patent Number: 4,982,192
[45] Date of Patent: Jan. 1, 1991

[54] DIGITAL-TO-ANALOG CONVERTER HAVING COMMON ADJUSTMENT MEANS

[75] Inventor: Fumio Murooka, Kanagawa, Japan

[73] Assignee: Canon Kabushiki Kaisha, Tokyo, Japan

[21] Appl. No.: 145,653

[22] Filed: Jan. 13, 1988

Related U.S. Application Data

[63] Continuation of Ser. No. 833,809, Feb. 26, 1986, abandoned.

[30] Foreign Application Priority Data

Feb. 28, 1985 [JP] Japan ................... 60-037377

[51] Int. Cl.$^5$ ............................................. H03M 1/00
[52] U.S. Cl. ..................................... 341/127; 341/135
[58] Field of Search ............... 341/126, 127, 135, 134, 341/899, 165

[56] References Cited

U.S. PATENT DOCUMENTS

| | | | |
|---|---|---|---|
| 4,431,986 | 2/1984 | Haque | 340/347 DA |
| 4,488,144 | 12/1984 | Wollman | 341/127 |
| 4,539,552 | 9/1985 | Davis | 340/347 DA |
| 4,595,912 | 6/1986 | Hoehn | 341/135 |
| 4,607,249 | 8/1986 | Naylor | 341/135 |
| 4,891,645 | 1/1990 | Lewis et al. | 341/127 |

OTHER PUBLICATIONS

Tatro "Electronics" Jul. 25, 1974 pp. 89-93.

Primary Examiner—William M. Shoop, Jr.
Assistant Examiner—Helen Kim
Attorney, Agent, or Firm—Toren, McGeady & Associates

[57] ABSTRACT

A digital-to-analog converter which includes a digital-to-analog conversion circuit of the current output type, a current-to-voltage conversion circuit receptive of an analog current produced form the digital-to-analog conversion circuit in correspondence to an input digital signal value, for converting the analog current to a voltage and producing it at the output thereof in an output stage of the converter, a first drive circuit for driving the digital-to-analog conversion circuit with constant current, and a second drive circuit which is controlled by the first drive circuit to drive the current-to-voltage conversion circuit with constant current, thereby it being made possible to arrange a plurality of digital-to-analog converters in a simple structure.

17 Claims, 1 Drawing Sheet

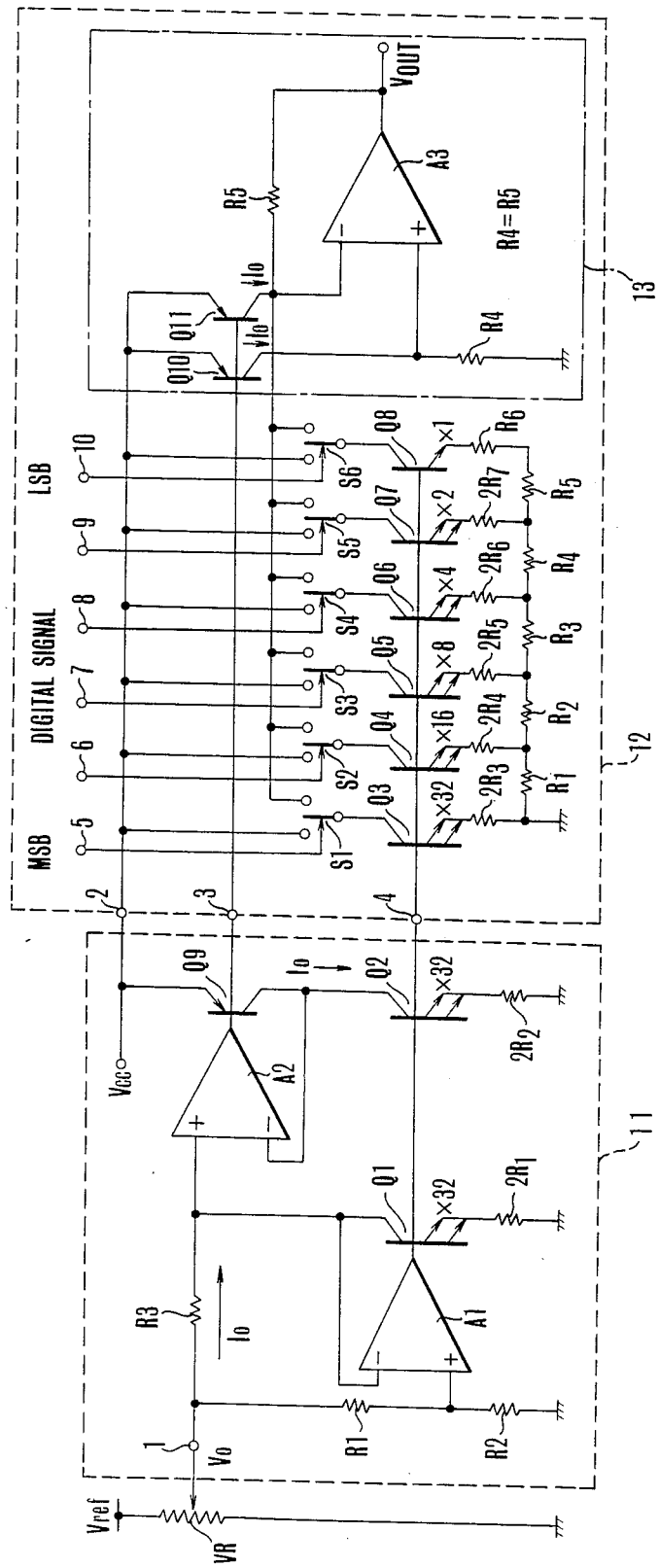

DIGITAL-TO-ANALOG CONVERTER HAVING COMMON ADJUSTMENT MEANS

This is a continuation of application Ser. No. 833,809, filed Feb. 26, 1986, now abandoned.

BACKGROUND OF THE INVENTION

1. Field of the Invention

This invention relates to a digital-to-analog converter.

2. Description of the Prior Art

Recently, concerning analog-to-digital and digital-to-analog converters, there have been increased demands for much higher accuracy, greater resolving power and faster speed. Particularly in application to public welfare, from the point of view of economy, one-chip monolithic IC fabrication techniques have been employed.

In parallelism with pursuit for such high performance, attempts to achieve cost reductions have been made, in the case of a system that necessitates a great number of A/D and D/A converters, by fabricating a plurality of A/D and D/A converters in a single chip.

However, such an IC chip of D/A converters or the like had many places to be tested when in full scale adjusting operations, and its work was very troublesome.

SUMMARY OF THE INVENTION

An object of the present invention is to eliminate the above-described problem and to provide a digital-to-analog converter whose full scale adjustment can be made in one place and which enables a plurality of digital-to-analog converter element, operating with a common electrical power source, to be incorporated.

To achieve such an object, in an embodiment of the invention, the digital-to-analog converter comprises a digital-to-analog conversion circuit of the current output type receptive of a digital signal for producing an analog current at an output thereof, a current-to-voltage conversion circuit receptive of the analog current for producing a voltage at an output thereof and arranged in an output stage of the converter, first drive means for producing a constant current by which the digital-to-analog conversion circuit is driven, and second drive means controlled by the first drive means to produce a constant current by which the current-to-voltage conversion circuit is driven. Therefore, according to the invention, it is made possible, to provide a digital-to-analog converter which enables a single place to suffice for full scale adjustment, a single electrical power source to suffice for operation, and a plurality of digital-to-analog conversion circuits to be connected in parallel to each other.

Other objects and features of the invention will become apparent from the following description and drawing.

BRIEF DESCRIPTION OF THE DRAWING

The single FIGURE is an electrical circuit diagram of an embodiment of a 6-bit digital-to-analog converter according to the present invention.

DETAILED DESCRIPTION OF THE PREFERRED EMBODIMENTS

The present invention will next be described in detail by reference to the drawing.

In the single FIGURE, there is shown the digital-to-analog converter of the invention comprising a bias circuit 11, a digital-to-analog conversion circuit 12 and a current-to-voltage conversion circuit 13 constituting an output stage of the digital-to-analog conversion circuit 12.

A voltage V0 is obtained from a reference voltage Vref by a bleeder (variable resistor) VR and is applied to an input terminal 1 of the bias circuit 11. A voltage divider of resistors R1 and R2 produces an output representative of a fraction of the voltage V0 which is applied to a non-inverting input terminal of a first operational amplifier A1. Another voltage which falls from the voltage V0 through a resistor R3 is applied to the non-inverting input terminal of a second operational amplifier A2.

The output terminal of the first operational amplifier A1 is connected to the base of a transistor Q1 (NPN type, emitter area: 32), and its inverting input terminal is connected to the collector of the transistor Q1. The emitter of the transistor Q1 is connected through a resistor 2R1 (having a resistance value: $2 \times R$ (prescribed value)) to circuit ground. Connected also to the base of the transistor Q1 is the base of another transistor Q2 (NPN type, emitter area: 32). The collector of the transistor Q1 is also connected to the non-inverting input terminal of the second operational amplifier A2.

The emitter of the transistor Q2 is connected through a resistor 2R2 to circuit ground, and its collector is connected to the collector of another transistor Q9 (PNP type). Connected to the base of the transistor Q9 is the output terminal of the second operational amplifier A2, and its inverting input terminal is connected to the collector of the transistor Q9. Applied to the emitter of the transistor Q9 is a voltage of the electrical power source or battery Vcc.

In the bias circuit 11 of such construction, the voltage at the non-inverting input terminal of the first operational amplifier A1 has a value of $R2 \times V0/(R1+R2)$. This value is taken by the collector voltage of the transistor Q1. Therefore, a current I0 flowing through the resistor R3 is found to be $I0=\{V0-R2 \times V0/(R1+R2)\}/R3$. Neglecting the input bias current of the two operational amplifiers A1 and A2, we have this current I0 as the collector current of the transistor Q1. This is then mirrored to the transistor Q2 whose base-emitter path has a voltage common to that of the transistor Q1, so that the collector current of the transistor Q2 takes the value I0. Also the value of the collector current of the transistor Q9 is I0.

The digital-to-analog conversion circuit 12 has three input terminals 2 to 4 which are supplied, respectively, with the battery voltage Vcc, the base voltage of the transistor Q9, and the base voltage of the transistor Q2.

In the digital-to-analog conversion circuit 12, as the 6-bit D/A converting means, use is made of a ladder type network of a plurality of resistors having resistance values R and 2R in combination with six transistors Q3 to Q8 of respective emitter areas differentiated from one another so as to have corresponding weights to the respective bit locations of the digital signal in respect to the emitters of the transistors Q1 and Q2. The transistors Q3 to Q8 each have a voltage across the base-emitter path in common with that of the transistor Q2. Therefore, the collector currents of the transistors Q3 to Q8 have values dependent on their respective emitter areas.

In the current-to-voltage conversion circuit 13, the battery voltage Vcc from the input terminal 2 is applied to the emitters of two transistors Q10 and Q11 (both of PNP type), and the base voltage of the transistor Q9 is applied to their bases. The collector of one of the transistors Q10, is grounded through a resistor R4, and is connected to the non-inverting input terminal of a third operational amplifier A3. The collector of the other transistor Q11 is connected to the inverting input terminal of the third operational amplifier A3 and through a resistor R5, to the output terminal of the third operational amplifier A3. Because the two transistors Q10 and Q11 have a voltage across the base-emitter path in common with that of the transistor Q9 of the bias circuit 11, the collector current flowing to the transistor Q9 is mirrored so that the collector currents of the two transistors Q10 and Q11 each have the value I0.

Selectively connected to the collector of each of transistors Q3 to Q8 are the battery voltage Vcc and the collector the transistor Q11 through analog switches S1 to S6, respectively which are responsive to the level (high or low) of the digital signal applied to the digital signal input terminals 5 to 10. When the digital signal level is low, the analog switches S1 to S6 select the battery Vcc for connection, and when high, the collector of the transistor Q11 for connection.

In the current-to-voltage conversion circuit 13, the resistance value of the resistor R4 is made equal to that of the resistor R5. Therefore, when all the six digital signal input terminals become low level, the collector current I0 of the transistor Q11 flows to the resistor R5, causing the voltage at the output of the third operational amplifier A3, as the output of the digital-to-analog conversion circuit 12, to have a value of zero. Conversely, when all the six digital signal input terminals 5 to 10 change to high level, the sum of the collector current of the transistor Q11 and the current from the output terminal of the third operational amplifier A3 flows to the transistors Q3 to Q8. As a result, the voltage at the output terminal of the third operational amplifier A3 increases to a value of 2.I0.R5.63/64 since the current flowing to R5 is I0.31/32. Therefore, for an actual given digital signal, as the six digital signal input terminals 5 to 10 have respective different weights, the analog voltage at the output of the third operational amplifier A3 can take any value in a range from 0 to 2.I0.R5.63/64.

The converter of the character described above has a feature that the transistor Q1, the first operational amplifier A1, whose bias voltage is determined by the ratio of the resistance values of the resistor R1 and R2, and the resistor R3 which determines the collector current of the transistor Q11 constitute means for controlling the constant current flowing to the transistors Q3 to Q8 of the digital-to-analog conversion circuit; another feature that the transistors Q2 and Q9 and the second operational amplifier A2 constitute means for controlling the constant current to the current-to-voltage conversion circuit 12, from which the voltage is obtained in analog form as converted from the digital one; and still another feature that the bias circuit 11 and the digital-to-analog conversion circuit 12 are connected to a single electrical power source.

Therefore, the full scale adjusting operation can be performed only by adjusting the bleeder VR. Also, because the resistor R3 and the pair of resistors R4 and R5 are laid usually under the same temperature condition, despite the value of the resistor R3 being changed by the change of the temperature after the full scale adjustment, the output of the third operational amplifier A3 is left unchanged, although the current I0 changes, for the pair of resistors R4 and R5 undergo the same change as that of the resistor R3. Moreover, the collector currents of the transistors Q3 to Q8 change in correspondence with the change of the current I0. This also contributes to stabilization of the output of the third operational amplifier A3.

Because the bias potential for the third operational amplifier A3 is set at I0.R4, a voltage margin of the network of the transistors Q3 to Q8 and the analog switches S1 to S6 can be ensured. Therefore, the single electrical power source suffices for operating the converter of the invention. Also, this allows for parallel connection of a plurality of digital-to-analog conversion circuit units 12 to a common bias circuit 11 to be realized.

What is claimed is:

1. A digital-to-analog converter comprising;
   (a) a digital-to-analog conversion circuit of a current output type;
   (b) a current-to-voltage conversion circuit for converting an anlog output current from said digital-to-analog conversion circuit into a voltage and producing the same;
   (c) a driving circuit for driving said digital-to-analog conversion circuit and said current-to-voltage conversion circuit with constant current; and
   (d) common adjustment means connected to said driving circuit to simultaneously change said constant current for driving, respectively, said digital-to-analog conversion circuit and said current-to-voltage conversion circuit.

2. A digital-to-analog converter according to claim 1, wherein the current-to-voltage conversion circuit has a reference input terminal biased to a voltage of ½ of a maximum output voltage.

3. A digital-to-analog converter according to claim 2, wherein said current-to-voltage conversion circuit includes an operational amplifier, and said operational amplifier has a non-inverting input terminal biased to the voltage of ½ of the maximum output voltage, and further has the output current of said digital-to-analog conversion circuit supplied to an inverting input terminal thereof.

4. A digital-to-analog converter according to claim 1, wherein said driving circuit includes a first current mirror circuit for driving said digital-to-analog conversion circuit with constant current, and a second current mirror circuit for driving said current-to-voltage conversion circuit with constant current.

5. A digital-to-analog converter according to claim 4, further comprising a first operational amplifier for controlling an amount of current of said first control mirror circuit, and a second operational amplifier for controlling an amount of current of said second current mirror circuit.

6. A digital-to-analog converter according to claim 1, wherein said digital-to-analog converter further comprises a single power source for driving said digital-to-analog conversion circuit and said current-to-voltage conversion circuit.

7. A digital-to-analog converter according to claim 1 or 6, wherein said current-to-voltage conversion circuit has an output voltage which is about equal to that of a power source voltage and is of unipolar nature.

8. A digital-to-analog converter according to claim 1, wherein said digital-to-analog conversion circuit, said current-to-voltage conversion circuit, and said driving circuit are formed into a monolithic integrated circuit (IC).

9. A digital-to-analog converter comprising:
(a) a digital-to-analog conversion circuit of a current output type;
(b) a current-to-voltage conversion circuit for converting an analog output current of said digital-to-analog conversion circuit into a voltage and producing the same;
(c) a driving circuit for driving said digital-to-analog conversion circuit and said current-to-voltage conversion circuit with constant current; and
(d) temperature compensation means connected to said driving circuit for simultaneously compensating changes due to temperature of said constant current for driving said digital-to-analog conversion circuit and said current-to-voltage conversion circuit, said temperature compensation means including a resistance element provided within said driving circuit so as to convert a reference voltage supplied from outside into a reference current, and a resistance element provided within said current-to-voltage conversion circuit, both said resistance elements having the same temperature characteristics.

10. A digital-to-analog converter according to claim 9, wherein said current-to-voltage conversion circuit has a reference input terminal biased to a voltage of ½ of a maximum output voltage.

11. A digital-to-analog converter according to claim 10, wherein said current-to-voltage conversion circuit includes an operational amplifier, and said operational amplifier has a non-inverting input terminal biased to the voltage of ½ of the maximum output voltage, and has the output current of said digital-to-analog conversion circuit supplied to an inverting input terminal thereof.

12. A digital-to-analog converter according to claim 9, wherein said driving circuit includes a first current mirror circuit for driving said digital-to-analog conversion circuit with constant current, and a second current mirror circuit for driving said current-to-voltage conversion circuit with constant current.

13. A digital-to-analog converter according to claim 12, further comprising a first operational amplifier for controlling an amount of current of said first current mirror circuit, and a second operational amplifier for controlling an amount of current of said second current mirror circuit.

14. A digital-to-analog converter according to claim 9, wherein said digital-to-analog conversion circuit and said current-to-voltage conversion circuit are driven by a single power source.

15. A digital-to-analog converter according to claim 9 or claim 14, wherein said current-to-voltage conversion circuit has an output voltage which is about equal to that of a power source voltage and is of a unipolar nature.

16. A digital-to-analog converter according to claim 9, wherein said digital-to-analog conversion circuit, said current-to-voltage conversion circuit, and said driving circuit are formed into a monolithic integrated circuit (IC).

17. A digital-to-analog converter according to claim 9 wherein said resistance element provided within said driving circuit is a diffused resistor formed within said monolithic IC.

* * * * *